(12) United States Patent
Ishikawa et al.

(10) Patent No.: US 6,431,964 B1
(45) Date of Patent: Aug. 13, 2002

(54) PLANARIZATION APPARATUS AND METHOD

(75) Inventors: Toshihiko Ishikawa; Yasushi Katagiri, both of Mitaka (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 0 days.

(21) Appl. No.: 09/477,449

(22) Filed: Jan. 4, 2000

(30) Foreign Application Priority Data

Jan. 6, 1999 (JP) ............................................ 11-001317
Nov. 11, 1999 (JP) ............................................ 11-321432

(51) Int. Cl.⁷ ............................................. B24B 7/00
(52) U.S. Cl. ...................... 451/65; 451/288; 451/287; 451/57
(58) Field of Search ................................ 451/288, 287, 451/285, 271, 57, 65, 41, 56, 443, 444, 5, 8

(56) References Cited

U.S. PATENT DOCUMENTS

| 5,827,110 A | * | 10/1998 | Yajima et al. | 451/5 |
| 5,888,120 A | * | 3/1999 | Doran | 451/55 |
| 5,967,885 A | * | 10/1999 | Crevasse et al. | 451/285 |
| 6,042,455 A | * | 3/2000 | Togawa et al. | 451/59 |
| 6,074,277 A | * | 6/2000 | Arai | 451/8 |
| 6,095,899 A | * | 8/2000 | Elmar et al. | 451/41 |
| 6,117,778 A | * | 9/2000 | Jone et al. | 451/287 |
| 6,162,112 A | * | 12/2000 | Miyazaki et al. | 451/41 |
| 6,183,345 B1 | * | 2/2001 | Kamono et al. | 451/8 |

FOREIGN PATENT DOCUMENTS

| GB | 2 314 037 | 12/1997 |
| JP | 60-76959 | 5/1985 |
| JP | 6-338484 | 12/1994 |
| JP | 7-40239 | 2/1995 |
| JP | 08-336741 | 12/1996 |
| JP | 9-254020 | 9/1997 |

* cited by examiner

Primary Examiner—Joseph J. Hail, III
Assistant Examiner—Lee Wilson
(74) Attorney, Agent, or Firm—Nixon Peabody LLP; David S. Safran

(57) ABSTRACT

A polishing stage is mounted on a body provided with a rough grinding stage and a fine grinding stage so that a wafer can be roughly ground, finely ground and polished in one planarization apparatus. The planarization apparatus also has a cleaning stage for cleaning a polishing pad of the polishing stage to thereby clean the dirty cleaning pad. The planarization apparatus is also provided with an etching unit to thereby perform a sequence of planarization from the rough grinding to the etching.

35 Claims, 14 Drawing Sheets

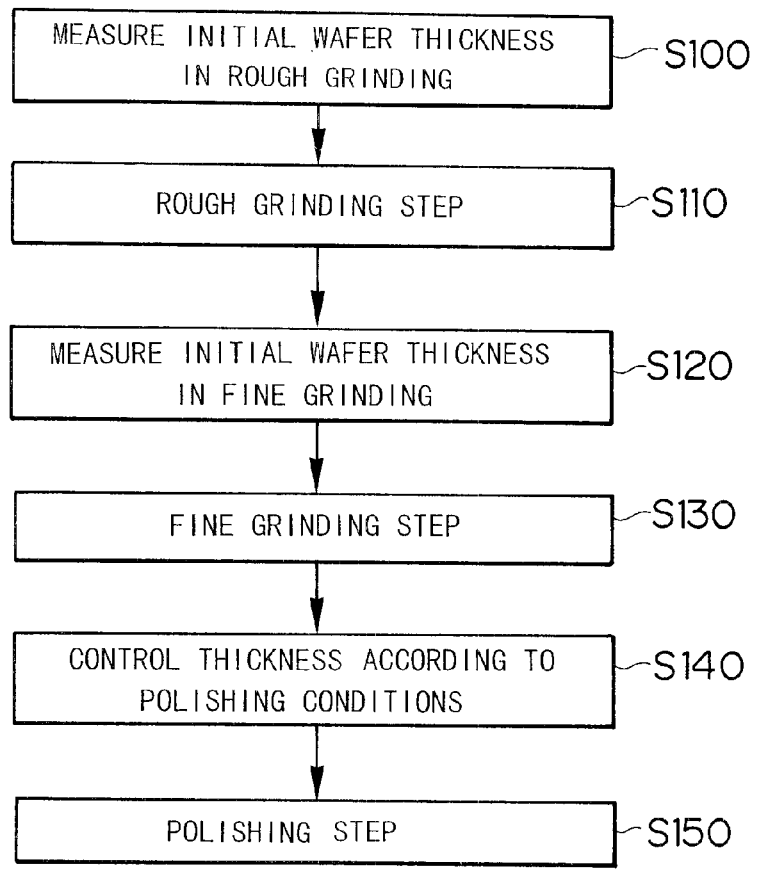

F I G. 1 4
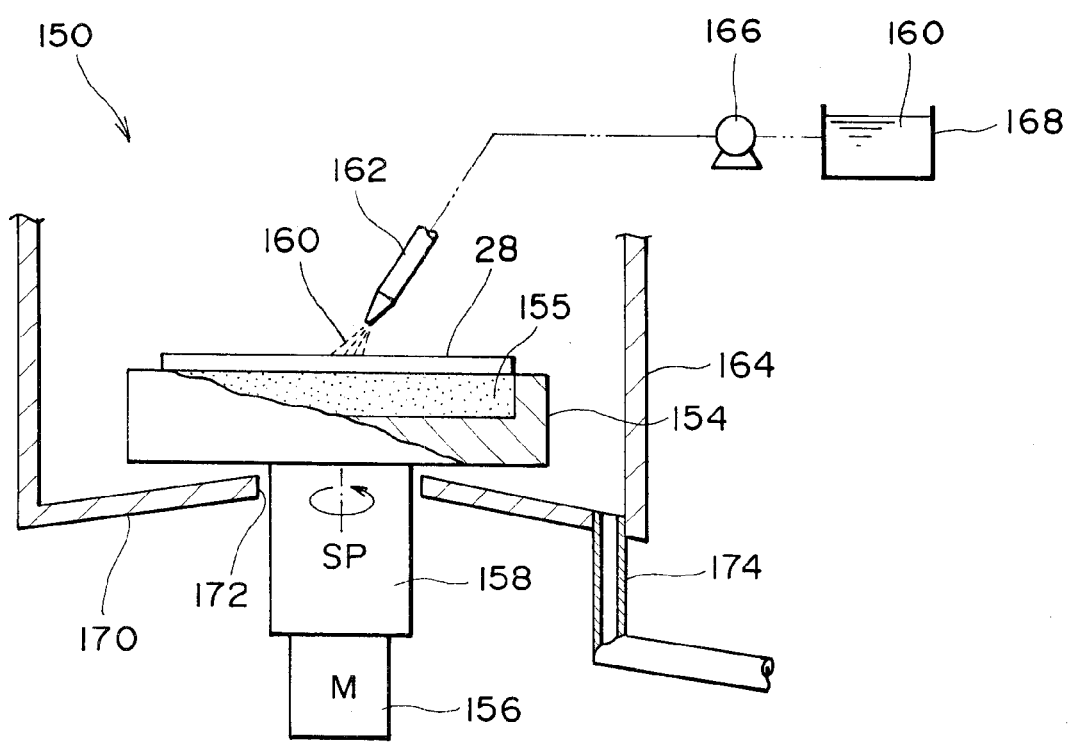

PLANARIZATION APPARATUS AND METHOD

BACKGROUND OF THE INVENTION

1. Field of the Invention

The present invention relates generally to a planarization apparatus and method, and more particularly to a planarization apparatus and method for planarizing the reverse of a semiconductor wafer on which no chip is formed in a semiconductor wafer manufacturing process.

2. Description of Related Art

A planarization apparatus for grinding the reverse (one side) of a semiconductor wafer has chucks for holding the wafer by suction, a rough grinding wheel, a fine grinding wheel, a reverse cleaning unit, and the like. One chuck holds the obverse (the other side) of the wafer, and then the rough grinding wheel is pressed against the reverse of the wafer. The reverse of the wafer is roughly ground by rotating the chuck and the grinding wheel. The roughly-ground wafer is detached from the chuck and is held by another chuck for the fine grinding so that the wafer can be finely ground by the fine grinding wheel. The finely-ground wafer is transferred to the reverse cleaning unit so that the reverse of the wafer can be cleaned. That completes the grinding of the reverse of one wafer by the planarization apparatus.

The wafer whose reverse has already been ground is transferred from the planarization apparatus to an etching apparatus, which etches the wafer to remove a machining deteriorated layer formed at the reverse of the wafer.

If the wafer is ground into an extremely thin wafer close to a standardized article, the wafer is damaged (cracked or chipped) because of the machining deteriorated layer when the wafer is transferred from the planarization apparatus to the etching apparatus.

To address this problem, the conventional planarization apparatus grinds the wafer to such a thickness as not to damage the wafer during the transfer. With respect to the thickness of the wafer, the planarization apparatus roughly grinds the wafer with the thickness of 725 $\mu$m sliced from an ingot to the thickness of 250 $\mu$m, and finely grinds the wafer to the thickness of 200 $\mu$m. The wafer is machined to the standardized thickness of 50 $\mu$m at the etching step.

The conventional planarization apparatus, however, cannot grind the wafer close to the standardized thickness in order to prevent the wafer from being damaged during the transfer. For this reason, a machining allowance (150 $\mu$m in the above example) is large at the etching step. Thus, it takes a long time to etch the wafer, and the throughput cannot be improved.

SUMMARY OF THE INVENTION

In view of the foregoing, it is an object of the present invention to provide a planarization apparatus and method which improve the throughput without damaging a workpiece.

The above object can be achieved by providing a planarization apparatus which comprises a holding means for holding a workpiece and a grinding means which has a grinding wheel for grinding the workpiece and grinds one side of the workpiece by the grinding wheel, the planarization apparatus comprising: a polishing means for polishing the one side of the workpiece, the polishing means comprising a rotating means for rotating a polishing head and a positioning mechanism for setting an interval between the polishing head and the workpiece.

The above object can be achieved by providing a planarization apparatus comprising: a holding means for holding a workpiece; a rough grinding means for roughly grinding the workpiece held by the holding means; a fine grinding means for finely grinding the workpiece roughly ground by the rough grinding means in the state wherein the holding means is holding the workpiece; a polishing means for polishing the workpiece finely ground by the fine grinding means in the state wherein the holding means is holding the workpiece; and a moving means for moving the holding means to a rough grinding position for the rough grinding means, a fine grinding position for the fine grinding means, and a polishing position for the polishing means.

The above object can be achieved by providing a planarization method using a planarization apparatus comprising: holding means for holding a workpiece; grinding means for grinding the workpiece held by the holding means; polishing means for polishing the workpiece ground by the grinding means; moving means for moving the holding means to a grinding position for the grinding means to grind the workpiece and to a polishing position for the polishing means to polish the workpiece; and wherein the polishing means polishes the workpiece by an amount more than an amount required for removing a machining deteriorated layer formed by the grinding, calculated by doubling a standard deviation, and less than a larger value between an amount required for correcting an unevenness of a thickness during the grinding and removing the machining deteriorated layer, calculated by sextupling a standard deviation, and 20 $\mu$m.

The above object can be achieved by providing a planarization method using a planarization apparatus comprising: holding means for holding a workpiece; rough grinding means for roughly grinding the workpiece held by the holding means; fine grinding means for finely grinding the workpiece roughly ground by the rough grinding means; polishing means for polishing the workpiece finely ground by the grinding means; moving means for moving the holding means to a rough grinding position for the rough grinding means, a fine grinding position for the fine grinding means and to a polishing position for the polishing means; wherein the fine grinding means finely grinds the workpiece by an amount more than an amount required for removing a machining deteriorated layer formed by the rough grinding, calculated by doubling a standard deviation, and less than a larger value between an amount required for correcting an unevenness of a thickness during the rough grinding and removing the machining deteriorated layer, calculated by sextupling a standard deviation, and 150 $\mu$m; and wherein the polishing means polishes the workpiece by an amount more than an amount required for removing a machining deteriorated layer formed by the fine grinding, calculated by doubling a standard deviation, and less than a larger value between an amount required for correcting an unevenness of a thickness during the fine grinding and removing the machining deteriorated layer and calculated by sextupling a standard deviation, and 20 $\mu$m.

According to the present invention, the planarization apparatus having the grinding means is provided with the polishing means, and this enables the grinding and polishing of the wafer in one apparatus. In the polishing method using the polishing means, the positioning mechanism positions the polishing head with respect to the workpiece, and the polishing head is pressed against the workpiece and is rotated by the rotating means. Consequently, the workpiece is polished. Since there is no necessity of transferring the workpiece from the planarization apparatus to the etching apparatus, the grinding means can grind the workpiece close to the standardized thickness. This reduces the time required for polishing the workpiece, and improves the throughput. The polishing removes the machining deteriorated layer formed by the grinding, and eliminates the necessity of etching in a post-treatment. This simplifies the entire structure of the workpiece manufacturing line, and reduces the size of the workpiece manufacturing line.

The workpiece may be polished in a constant pressure processing or in a constant cutting depth processing.

According to the present invention, the grinding means grinds the workpiece held by the holding means, and then, the polishing means polishes the workpiece after the moving means moves the holding means to the polishing position. More specifically, the workpiece held by the holding means is ground and polished, and it enables the accurate machining without damaging the workpiece. On the other hand, an apparatus, which transfers the workpiece from a holding means for grinding means to a holding means for a polishing means has such a problem that the workpiece may be damaged by an external force. Moreover, the accuracy of the holding face of the holding means changes every time the workpiece is transferred, and the accuracy affects the machining accuracy of the workpiece. Thus, the workpiece cannot be machined accurately. The present invention solves this problem.

According to the present invention, the planarization apparatus has cleaning means for cleaning a polishing pad and/or dressing means for dressing a surface of the polishing pad. If the polishing pad becomes dirty or loaded, the planarization apparatus cleans and dresses the polishing pad.

According to the present invention, the grinding means or the polishing means machines a machining deteriorated layer formed at one side of the workpiece ground in previous machining or machines the machining deteriorated layer and an unevenness of the thickness of the workpiece. It is therefore possible to acquire an accurate workpiece.

According to the present invention, the holding means is provided in a plural number, and the moving means sequentially moves the holding means from the grinding position to the polishing position so that the grinding and the polishing can be performed at the same time. This increases the availability compared with the case where one holding means grinds and polishes the workpiece.

According to the present invention, the holding means connects to a spindle and is moved by the moving means. This eliminates the necessity of separating the spindle from the holding means and connecting to the holding means to a spindle at the next moved position every time the holding means is moved.

According to the present invention, the holding means is detachably connected to a spindle, and when the holding means is moved, the holding means is separated from the spindle and only the holding means is moved by the moving means. This reduces the load on the moving means. Moreover, it is only necessary to provide the spindles suitable for each machining, and this reduces the manufacturing cost for the apparatus.

According to the present invention, the holding means is holding means for holding the workpiece by suction, holding means for freeze-holding the workpiece through ice film, or electrostatic holding means for holding the workpiece with static electricity. Thus, the workpiece can be held securely.

According to the present invention, the planarization apparatus further comprises a partitioning member for partitioning off a polishing position for the polishing means to polish the workpiece. Therefore, the grinding fluid and the grinding layer never reach the polishing position, and the polishing fluid used by the polishing means never reaches the grinding position. This prevents a trouble resulting from the mixture of the grinding and polishing fluids and chips. Particularly if the polishing means performs a chemical-mechanical polishing, the polishing fluid includes a chemical-mechanical agent. If the grinding fluid is mixed in this polishing fluid, the concentration of the chemical-mechanical agent is lowered and the machining time becomes longer. The use of the partition solves this problem.

According to the present invention, a planarization apparatus comprises rough grinding means, fine grinding means and polishing means so that the workpiece can be roughly ground, finely ground and polished automatically. Moreover the planarization apparatus has moving means for moving the holding means to a rough grinding position for the rough grinding means, a fine grinding position for the fine grinding means, and a polishing position for the polishing means. Consequently, the apparatus can work without lowering the rate of operation thereof even if single or plural rough grinding means, fine grinding means and polishing means are combined.

According to the present invention, the planarization apparatus with the rough grinding means, the fine grinding means and the polishing means is provided with etching means for etching the workpiece. Thus, one planarization apparatus can perform the machining sequence from the rough grinding to the etching. In this case, the etching means may etch the workpiece having been finely ground before the polishing, or may etch the workpiece having been polished. More specifically, the light etching aiming at cleaning the ground workpiece may be performed before the polishing. The etching may be performed after the polishing in order to eliminate impurities, heavy metal or dot defects harmful to element characteristics in the chips or to perform gettering.

According to the present invention, the planarization method uses the planarization apparatus comprises grinding means and polishing means. The polishing means polishes the workpiece by an amount more than an amount required for removing a machining deteriorated layer formed by the grinding, calculated by doubling a standard deviation, and less than a larger value between an amount required for correcting an unevenness of a thickness during the grinding and removing the machining deteriorated layer, calculated by sextupling a standard deviation, and 20 $\mu$m. This enables the desired machining without decreasing the availability of the apparatus.

According to the present invention, the planarization method uses the planarization apparatus comprises rough grinding means and fine grinding means as grinding means. The fine grinding means finely grinds by an amount more than an amount required for removing a machining deteriorated layer formed by the rough grinding, calculated by doubling a standard deviation, and less than a larger value between an amount required for correcting an unevenness of a thickness during the rough grinding and removing the machining deteriorated layer, calculated by sextupling a standard deviation, and 150 $\mu$m. The polishing means polishes the workpiece by an amount more than an amount required for removing a machining deteriorated layer formed by the fine grinding, calculated by doubling a standard deviation, and less than a larger value between an amount required for correcting an unevenness of a thickness during the fine grinding and removing the machining deteriorated layer, calculated by sextupling a standard deviation, and 20 $\mu$m.

According to the present invention, the planarization apparatus has a sensor for measuring the thickness of the workpiece prior to machining or during machining, and the planarization apparatus controls the amount of material to be ground or polished in accordance with a measured value.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 11 is a flow chart showing a process for controlling the thickness of the wafer in the planarization apparatus;

FIG. 12 is a table showing machining speeds, amounts of material to be machined and machining times in a rough grinding, a fine grinding and a polishing;

FIG. 14 a sectional view showing the structure of the etching unit in FIG. 13;

DETAILED DESCRIPTION OF THE PREFERRED EMBODIMENT

This invention will be described in further detail by way of example with reference to the accompanying drawings.

Figure 1:
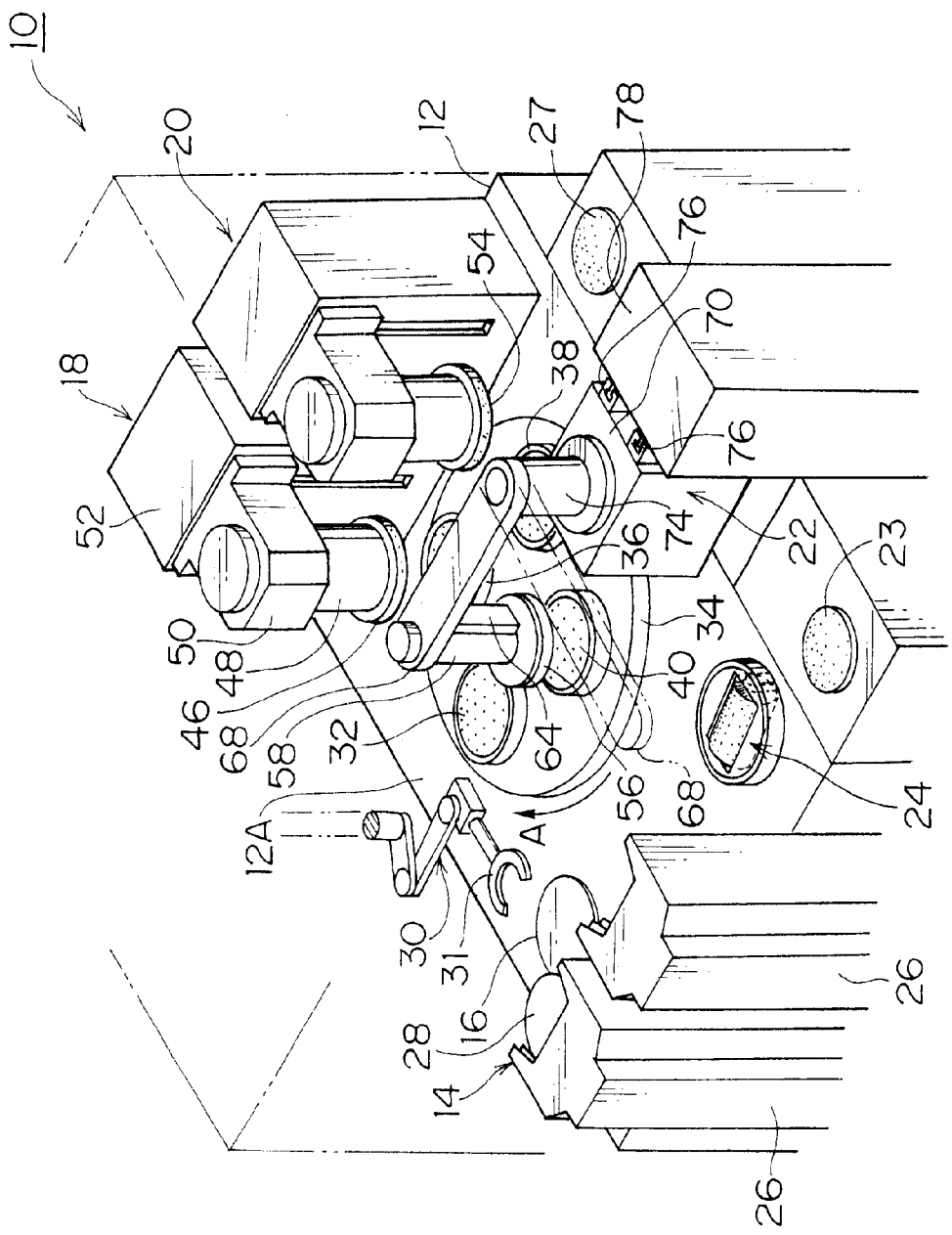
FIG. 1 is a perspective view showing a semiconductor planarization apparatus according to an embodiment of the present invention.
Figure 2:
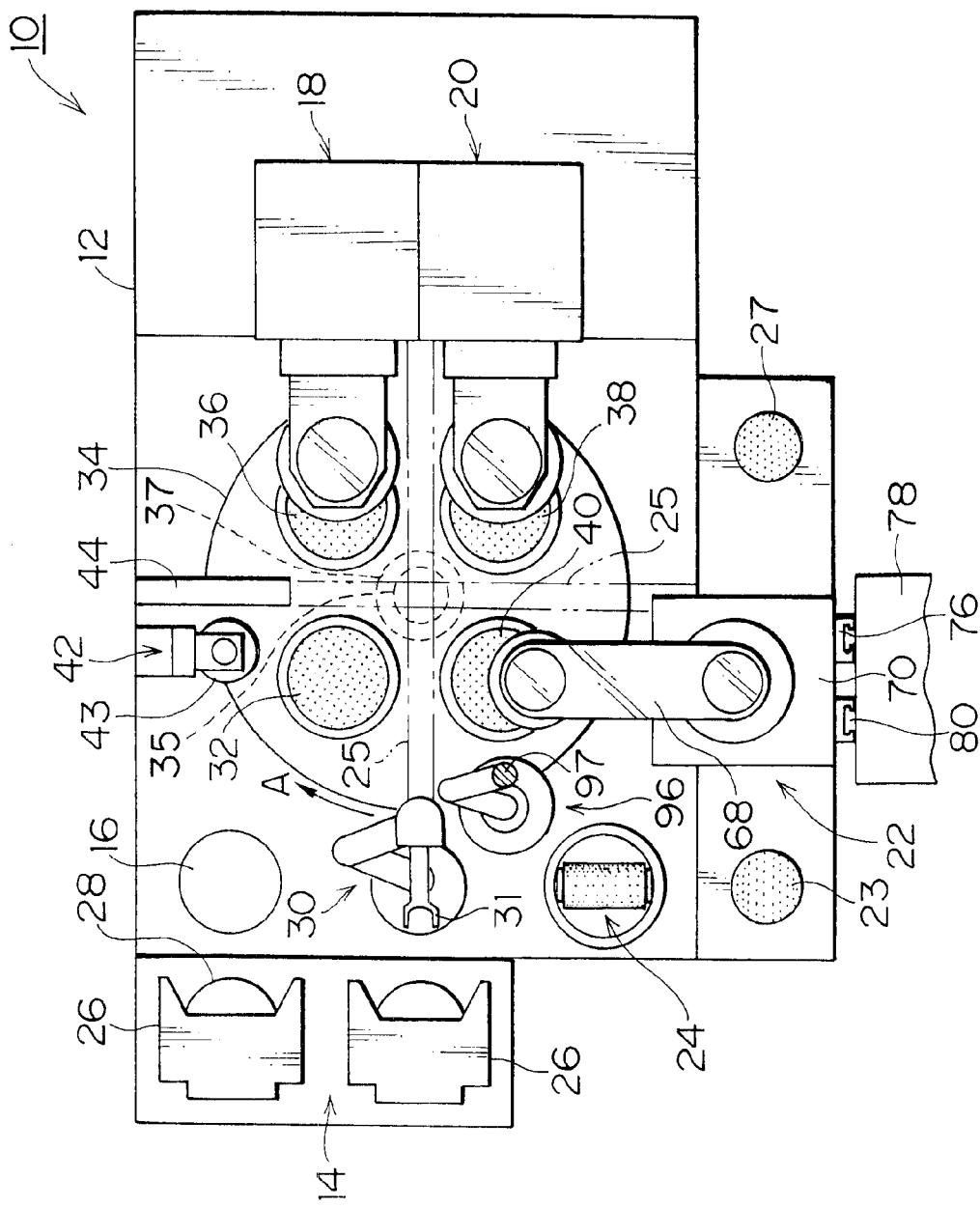
FIG. 2 is a plan view showing the planarization apparatus in FIG. 1.

FIG. 1 is a perspective view showing a semiconductor wafer planarization apparatus, and FIG. 2 is a plan view thereof.

As shown in FIG. 1, a body 12 of a planarization apparatus 10 has a cassette housing stage 14, an alignment stage 16, a rough grinding stage 18, a fine grinding stage 20, a polishing stage 22, a polishing pad cleaning stage 23, a polishing pad dressing stage 27 and a wafer cleaning stage 24. The rough grinding stage 18, the fine grinding stage 20 and the polishing stage 22 are partitioned by a partition 25 indicated by alternate long and two short dashes lines in FIG. 2 in order to prevent machining liquids used at the stages 18, 20, 22 from splashing to the adjacent stages.

Figure 4:
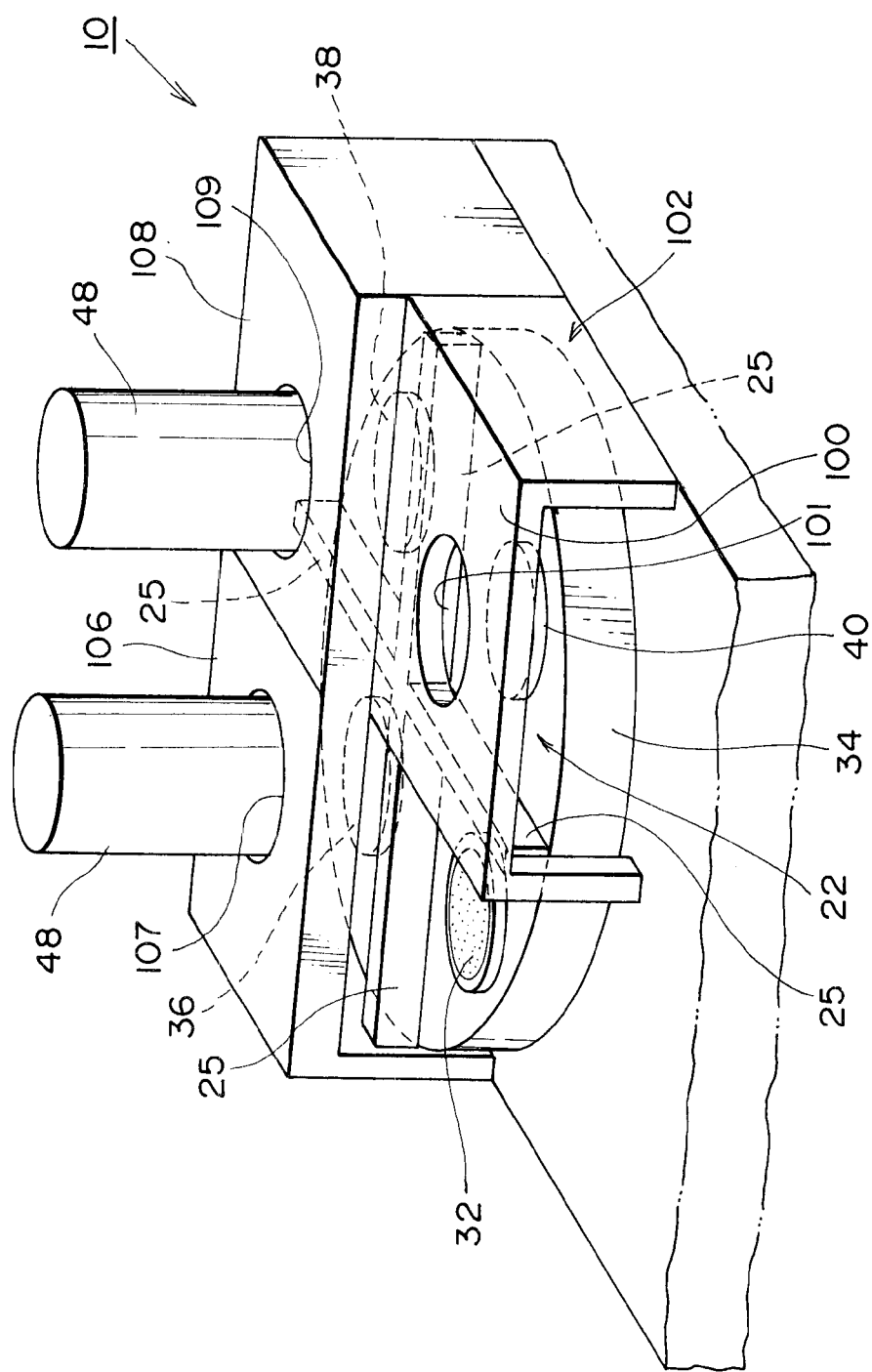
FIG. 4 is a perspective view showing a partition of the planarization apparatus in FIG. 1.
Figure 5:
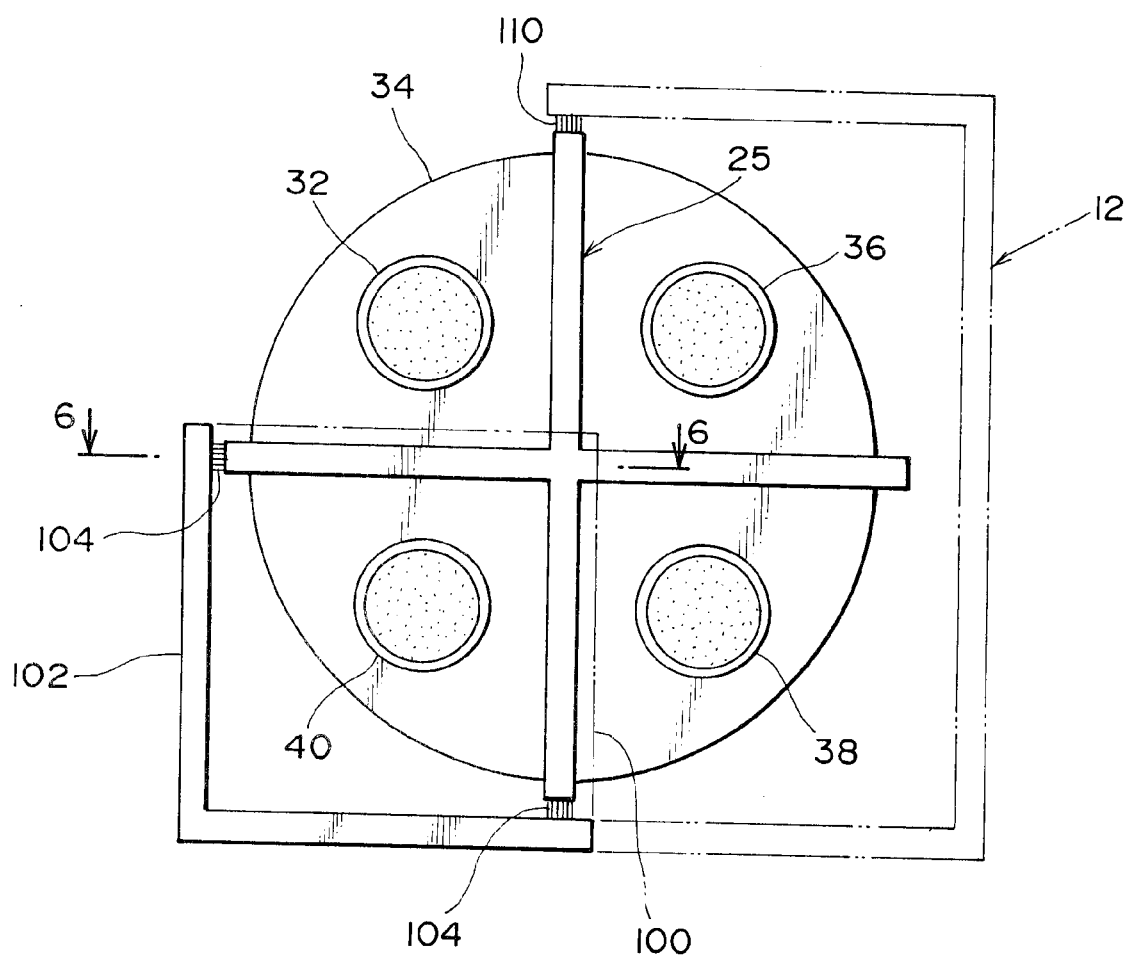
FIG. 5 is a plan view showing the partition in FIG. 4.
Figure 6:
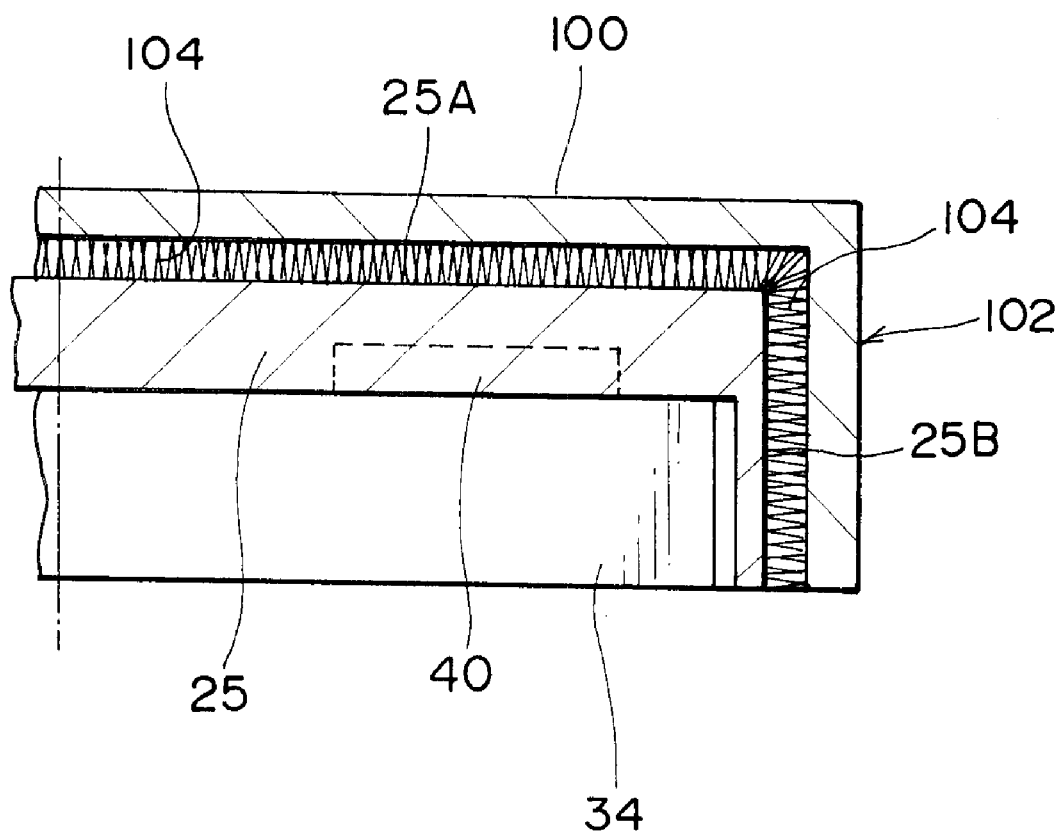
FIG. 6 is a sectional view of the partition taken along line 6—6 in FIG. 5.

The partition 25 is fixed on an index table 34 as shown in FIGS. 4 and 5 and is cross-shaped in such a manner as to partition four chucks (equivalent to holding means) 32, 36, 38, 40 disposed on the index table 34. The polishing stage 22 is covered with a casing 102 having a top board 100 so that the polishing stage 22 can be separate from the other stages. As shown in FIG. 6, a brush 104 is attached to the side of the casing 102 along the partition 25. When the chuck 40 is positioned at a machining position, the brush 104 comes into contact with a top 25A and a side 25B of the partition 25. Thus, the casing 102, the partition 25 and the brush 104 keep the polishing stage 22 almost airtight. This prevents a grinding fluid used at the fine grinding stage 20 and chips from entering the polishing stage 22, and prevents a polishing fluid used at the polishing stage 22 from splashing. It is therefore possible to prevent a malfunction resulting from the mixture of both fluids. The polishing stage 22 of this embodiment performs a chemical-mechanical polishing, and the polishing fluid includes a chemical polishing agent. If the grinding fluid is mixed in this polishing fluid, the concentration of the chemical polishing agent is lowered and this increases the machining time. The use of the partition 25 solves this problem.

As shown in FIGS. 4 and 5, the rough grinding stage 18 is enclosed by the side of the body 12, a top board 106 and the partition 25. Likewise, the fine grinding stage 20 is enclosed by the side of the body 12, a top board 108 and the partition 25. The top boards 100, 106, 108 have holes 101, 107, 109, through which heads of the stages are inserted. In FIG. 5, reference numeral 110 denotes a brush for separating the rough grinding stage 18 from the outside, and the brush 110 is in contact with the top and side of the partition 25.

Two cassettes 26 are detachably mounted at the cassette housing stage 14 in FIGS. 1 and 2, and the cassettes 26 contain a number of wafers whose reverses have not yet been ground. A hand 31 of a transfer robot 30 holds the wafers 28 individually, and sequentially transfers the wafers 28 to the alignment stage 16. The transfer robot 30 may be suspended from a beam (not illustrated) standing on the body 12 through a lift, and may be arranged at the top 12A of the body 12. Suspending the transfer robot 30 decreases an interval between the cassette housing stage 14 and the alignment stage 16, and this reduces the size of the planarization apparatus 10. The transfer robot 30 is a well-known multi-joint robot, and this will not be described here.

The alignment stage 16 positions the wafer 28, transferred from the cassettes 26, at a predetermined position. The wafer 28 positioned by the alignment stage 16 is held by the hand 31 of the transfer robot 30 again, and is transferred toward the empty chuck 32. The wafer 28 is held on the suction face of the chuck 32.

The chuck 32 is disposed on the index table 34, and the chucks 36, 38, 40 having the same function are disposed at intervals of 90° along the circumference of a rotary shaft 35 indicated by broken lines in FIG. 2. The rotary shaft 35 connects to a spindle (not illustrated) of a motor (equivalent to a moving means) 37 indicated by broken lines in FIG. 2. The chuck 36 is positioned at the rough grinding stage 18, which roughly grinds the held wafer 28. The chuck 38 is located at the fine grinding stage 20, which finishes the held wafer 28 (fine-grinding and spark-out grinding). The chuck 40 is located at the polishing stage 22, which polishes the held wafer 28 to eliminate a machining deteriorated layer caused by the grindings and the unevenness of the thickness of the wafer 28.

Figure 3:
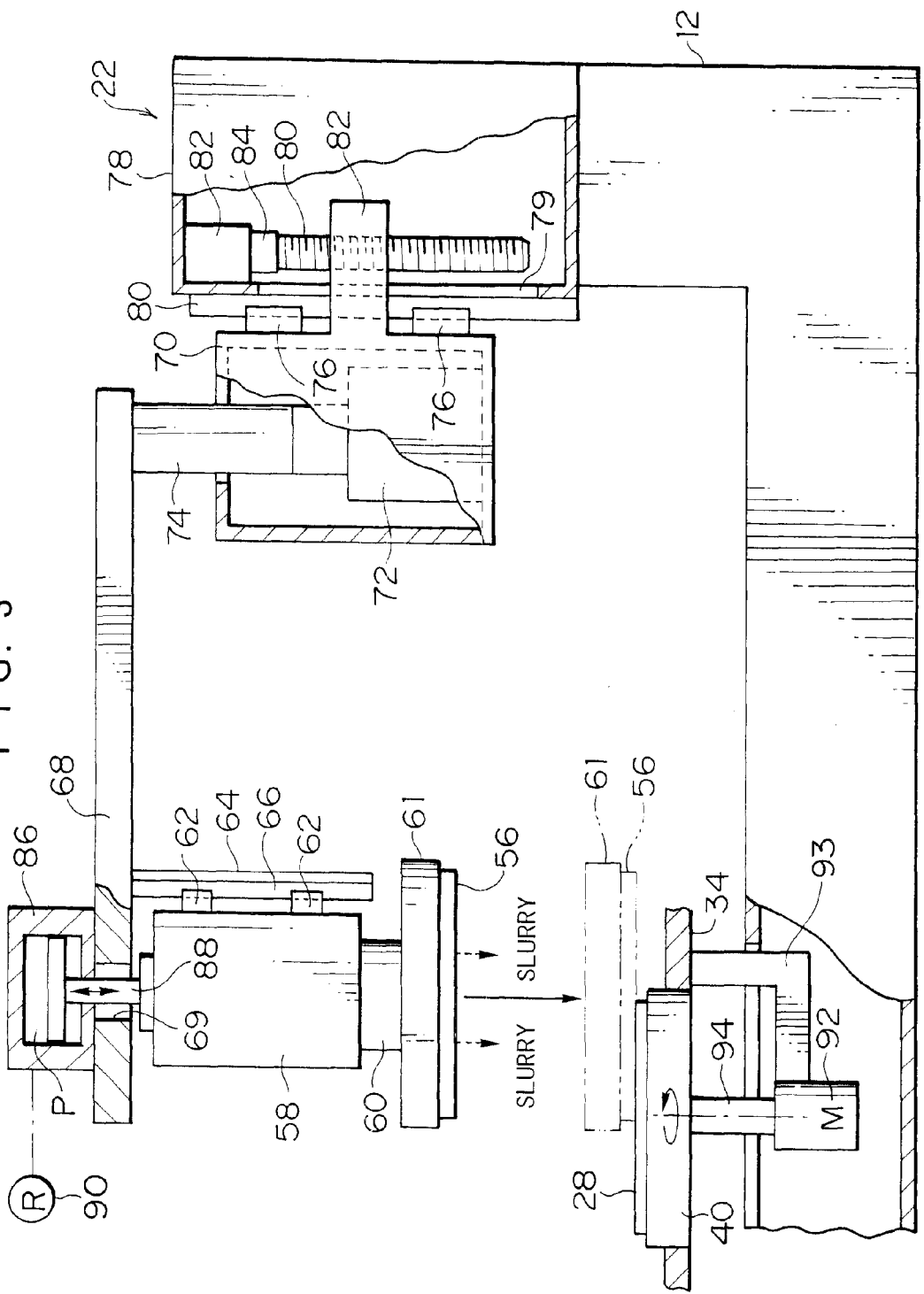
FIG. 3 is a sectional view showing the structure of a polishing stage in the planarization apparatus in FIG. 1.

The bottoms of the chucks 32, 36, 38, 40 connect to spindles 94 of rotary motors 92 as shown in FIG. 3, and the motors 92 rotate the chucks 32, 36, 38, 40. The motors 92 are supported on the index table 34 through support members 93. Thus, the motor 37 moves the chucks 32, 36, 38, 40 in the state wherein the spindles 94 of the motors 92 connect to the chucks 32, 36, 38, 40. This eliminates the necessity for separating the spindles 94 from the chucks 32, 36, 38, 40 and connecting the chucks 32, 36, 38, 40 to the spindles 94 of the motors 92 located at the next positions every time the motor 37 moves the chucks 32, 36, 38, 40.

Figure 7:
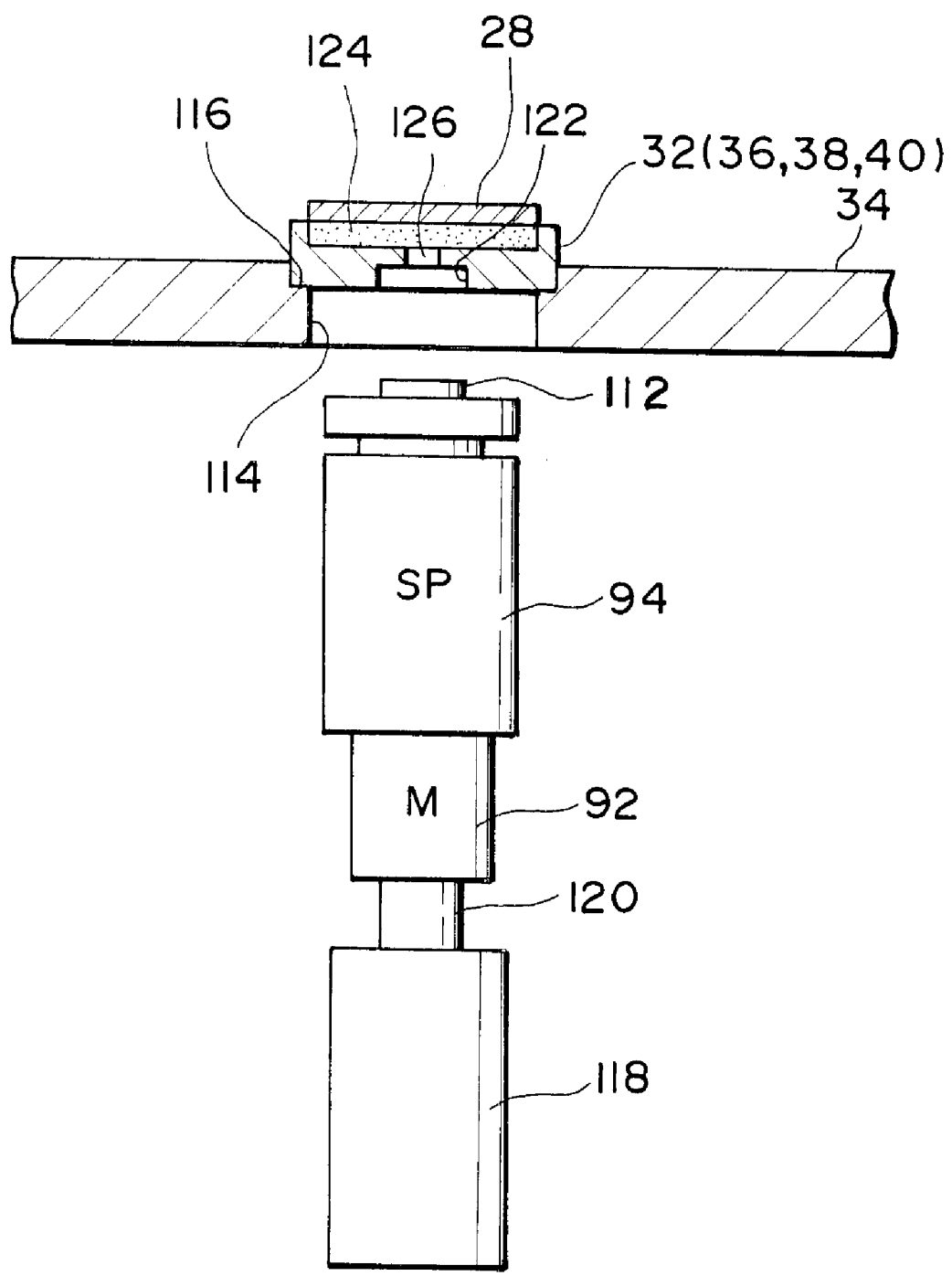
FIG. 7 is an explanation drawing showing the state wherein a chuck and a spindle are separated by a fluid joint.
Figure 8:
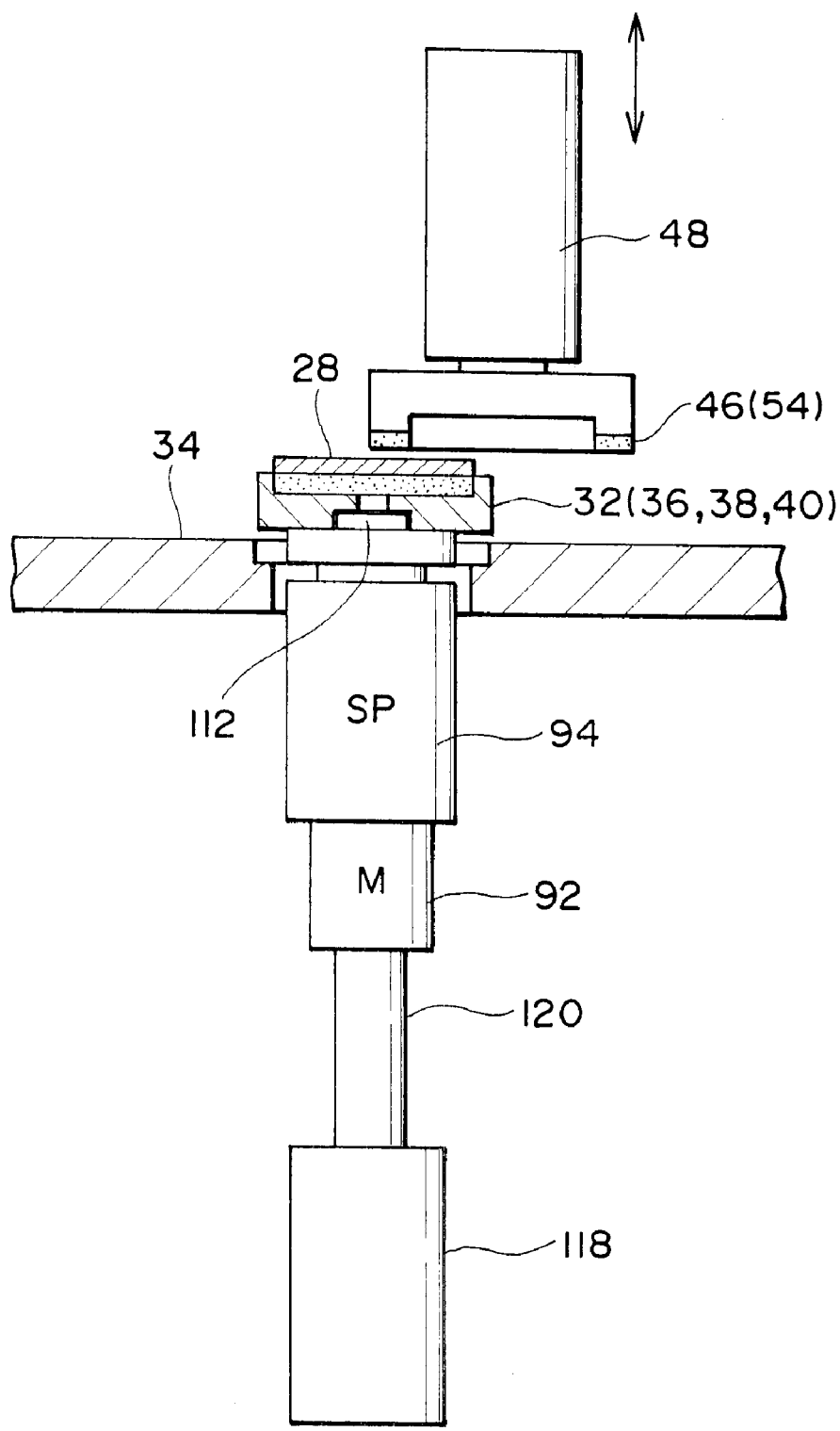
FIG. 8 is an explanation drawing showing the state wherein the chuck and the spindle are connected through the fluid joint.

In FIG. 3, the spindles 94 of the motors 92 connect to the chucks 32, 36, 38, 40, but this invention should not be restricted to this. As shown in FIG. 7 and 8, the spindles 94 may be detachably connected to the chucks 32, 36, 38, 40 through connecting members 112. In this case, the connecting members 112 are separated from the chucks 32, 36, 38, 40 and the motor 37 moves only the chucks 32, 36, 38, 40 every time the chucks 32, 36, 38, 40 are moved. This reduces the load on the motor 37 and reduces the cost of the apparatus since it is necessary to provide only spindles and motors suitable for the rough grinding, the fine grinding and the polishing.

In FIG. 7, the chucks 32, 36, 38, 40 are placed on steps 116 of openings 114 formed in the index table 34. Pistons 120 of cylinders 118 connect to the bottoms of the motors 92. If the pistons 120 are expanded as shown in FIG. 8, the connecting members 112 are moved through the openings 114 and are fitted in concave parts 122 formed at the bottoms of the chucks 32, 36, 38, 40. The continuous expansion of the pistons 120 moves the chucks 32, 36, 38, 40 from the index table toward grinding positions where grinding wheels 46, 54 grind the wafers 28.

The suction face of the chucks 32, 36, 38, 40 of this embodiment are made of porous material 124 composed of a sintered body such as ceramics. If the connecting members 112 are connected to the concave parts 122, fluid joints connect to the concave parts 122. Thus, a suction force of suction pumps (not illustrated) connected to the concave parts 112 acts on the porous material 124 through air passages 126, and this causes the wafer 28 to be securely held on the surface of the porous material 124. When the connecting members 112 are separated from the concave parts 122, a check valve (not illustrated) maintains the suction force.

Figure 9:
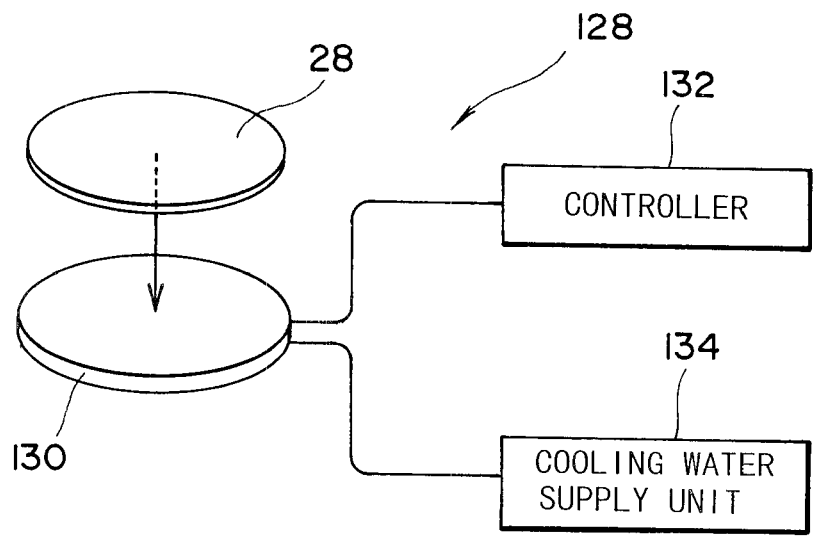
FIG. 9 is a view showing the structure of a freezing chuck unit.

In this embodiment, the chucks 32, 36, 38, 40 are used to hold the wafers 28 by suction, but a freezing chuck unit 128 in FIG. 9 may be used instead of the chucks 32, 36, 38, and 40.

The freezing chuck unit 128 comprises a chuck plate 130, a controller 132 and a cooling water supply unit 134. The controller 132 applies a voltage to the chuck plate 130, and the resulting Peltier effect freezes and holds the wafer 28 on the chuck plate 130 through ice film. The chuck plate 130 forms a closed circuit by connecting two kinds of metals (e.g., Cu and Bi) and passing an electric current through a contact thereof, thereby freezes and holds the wafer 28 on a thermo-element (Cu plate). The cooling water supply unit 134 supplies cooling water to a thermo-element (Bi plate) in order to cool the heat generated at the thermo-element (Bi plate). An electrostatic chuck unit, which holds the wafer by static electricity, may be used instead of the freezing chuck unit 128.

The suction face of the chuck 32 located at the chucking position in FIG. 2 is cleaned by a cleaning unit 42 (see FIG. 2) before the chuck 32 receives the wafer 28. The cleaning unit 42 is slidably provided on the rail 44. To clean the suction face, the cleaning unit 42 is moved along the rail 44 and is positioned above the chuck 32. The cleaning unit 42 has a removal member 43, which comes into contact with the suction face of the chuck 32 to remove the sludge, etc. from the suction face. If the suction face of the chuck 32 is made of porous material composed of a sintered body such as ceramics, the removal member 43 is made of the porous material.

Figure 10:
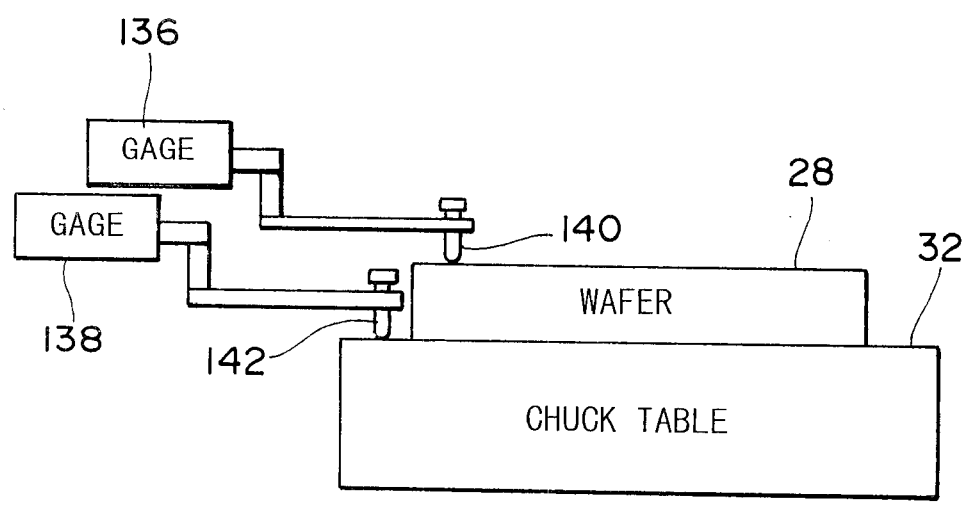
FIG. 10 is a side view showing a wafer thickness gage.

A pair of gages 136, 138 in FIG. 10 measures the thickness of the wafer 28 held by the chuck 32. The gages 136, 138 have contacts 140, 142, respectively. The contact 140 contacts the top (the reverse) of the wafer 28, and the contact 142 contacts the top of the chuck 32. The gages 136, 138 can determine the thickness of the wafer 28 as a difference between readings of an in-process gage with the top of the chuck 32 being a reference point.

Rotating the index table 34 by 90° in the direction of an arrow A in FIGS. 1 and 2 positions the measured wafer 28 on the rough grinding stage 18. A cup-shaped grinding wheel 46 roughly grinds the reverse of the wafer 28. As shown in FIG. 1, the cup-shaped grinding wheel 46 connects to an output shaft (not illustrated) of a motor 48, and is attached to a grinding wheel feed unit 52 through a support casing 50 of the motor 48. The grinding wheel feed unit 52 moves up and down the cup-shaped grinding wheel 46 as well as the motor 48, and the downward movement causes the cup-shaped grinding wheel 46 to be pressed against the reverse of the wafer 28. Thus, the reverse of the wafer 28 is roughly ground. The downward movement amount of the cup-shaped grinding wheel 46, i.e. the amount of material removed by the cup-shaped grinding wheel 46 is determined according to a previously-registered reference position of the cup-shaped grinding wheel 46 and the thickness of the wafer 28 detected by the gages 136, 138.

The thickness of the wafer 28 whose reverse has been roughly ground by the rough grinding stage 18 is measured by thickness gages with the same structure in FIG. 10 after the cup-shaped grinding wheel 46 moves away from the wafer 28. Rotating the index table 34 by 90° in the direction of the arrow A positions the measured wafer 28 on the fine grinding stage 20, and the cupshaped grinding wheel 54 finely grinds and spark-out grinds the wafer 28. The structure of the fine grinding stage 20 will not be explained here since it has the same structure as the rough grinding stage 18. In this embodiment, there are two grinding stages, but it is possible to provide only one grinding stage. The thickness gages may measure the thickness of the wafer 28 in line.

The thickness of the wafer 28 whose reverse has been finely ground by the fine grinding stage 20 is measured by thickness gages with the same structure in FIG. 10 after the cup-shaped grinding wheel 54 moves away from the wafer 28. Rotating the index table by 90° in the direction of the arrow A positions the measured wafer 28 at the polishing stage 22. The wafer 28 is polished by a polishing pad 56 of the polishing stage 22 in FIG. 3 and slurry supplied from the polishing pad 56. Consequently, the machining deteriorated layer is removed from the reverse of the wafer 28. The thickness gages may measure the thickness of the wafer 28 in line.

A description will be given of the control on the thickness of the wafer by the planarization apparatus 10 with reference to FIG. 11. First, the initial thickness of the wafer is measured before the rough grinding (S100), and the amount of material to be machined in the rough grinding is determined according to the measured thickness. Then, the wafer 28 is roughly ground at the rough grinding stage 18 (S110). The thickness of the roughly-ground wafer is measured (S120), and the amount of material to be machined in the fine grinding is determined according to the measured thickness. The wafer 28 is finely ground at the fine grinding stage 20 (S130). Then, the thickness of the finely-ground wafer is measured, and the polishing time is determined according to the measured thickness, the polishing conditions and the final thickness (S140). The wafer 28 is polished at the polishing stage 22 (S150). The planarization apparatus 10 controls the thickness of the wafer 28 in this manner.

The amount of material to be machined at the fine grinding stage 20 is preferably more than the amount required for removing the machining deteriorated layer generated by the rough grinding, calculated by doubling a standard deviation. It is preferably less than the larger value between the amount required for correcting the unevenness of the thickness during the rough grinding and removing the machining deteriorated layer, calculated by sextupling the standard deviation, and 150 $\mu$m. This enables the removal of the machining deteriorated layer generated by the rough grinding without decreasing the availability.

If the amount required for removing the machining deteriorated layer formed by the rough grinding is calculated by multiplying the standard deviation by less than two, the machining deteriorated layer cannot always be removed completely. On the other hand, if the amount required for removing the unevenness of the thickness and the machining deteriorated layer generated during the rough grinding is set at a value in excess of the larger value between a value found by multiplying a standard deviation by six, and 150 $\mu$m; the machining time becomes longer and the rate of operation is lowered.

The amount of material to be machined at the polishing stage 22 is preferably more than the amount required for removing the machining deteriorated layer generated by the fine grinding, calculated by doubling a standard deviation. It is preferably less than the larger value between the amount required for correcting the unevenness of the thickness during the fine grinding and removing the machining deteriorated layer, calculated by sextupling the standard deviation, and 20 $\mu$m. This enables the removal of the machining deteriorated layer generated by the fine grinding without lowering the rate of operation.

If the amount of material for removing the machining deteriorated layer formed by the fine grinding is calculated by multiplying the standard deviation by less than two, the machining deteriorated layer cannot always be removed without fail. On the other hand, if the amount required for correcting the unevenness of the thickness during the fine grinding and removing the machining deteriorated layer is set at a value that exceeds the larger value found by multiplying a standard deviation by six, and 20 $\mu$m; the machining time becomes longer and the rate of operation is lowered.

FIG. 12 is a table showing an example of the machining. If the wafer with a diameter of 200 mm and an initial thickness of 725 $\mu$m is to be machined to the thickness of 50 $\mu$m; the rough grinding speed, the fine grinding speed and the polishing speed are set at 225 ($\mu$m/min), 65 ($\mu$m/min) and 6 ($\mu$m/min), respectively, and the amounts of material to be machined in the fine grinding, the rough grinding and the polishing are set at 510 $\mu$m, 150 $\mu$m and 14.9 $\mu$m, respectively. In this case, the rough grinding time, the fine grinding time and the polishing time are substantially equal (2.27–2.48 min), so that the wafer 28 with the thickness of 725 $\mu$m can be machined to the thickness of 50 $\mu$m without lowering the rate of operation. In this case, the standard deviation of the unevenness in the thickness during the fine grinding is 2.25 $\mu$m, and six times the standard deviation is 13.5 $\mu$m. The mean of the depth of the machining deteriorated layer during the fine grinding is 0.7 $\mu$m, the standard deviation of the depth of the machining deteriorated layer is 0.11 $\mu$m, and six times the standard deviation is 0.66 $\mu$m. The maximum depth of the machining deteriorated layer is 1.36 $\mu$m. Therefore, the amount of material for eliminating the unevenness of the thickness at the fine grinding and removing the machining deteriorated layer can be set at 14.9 $\mu$m.

The unevenness of the thickness and the machining deteriorated layer cannot always be removed without fail within the machining time that is calculated in the above-mentioned manner.

To solve this problem, in this embodiment, the amount of material 150 $\mu$m in the fine grinding is compared with the amount required for eliminating the unevenness of the thickness and the machining deteriorated layer in the rough grinding, calculated by doubling a standard deviation. If the former is larger, the amount of material to be machined is set at 150 $\mu$m. If the latter is larger, the amount of material is set at the latter amount. Consequently, the unevenness of the thickness and the machining deteriorated layer can be eliminated without lowering the rate of operation and without failure during the fine grinding.

Moreover, the amount of material to be machined in the polishing is compared with the amount required for eliminating the unevenness of the thickness and the machining deteriorated layer in the fine grinding. If the former is larger, the amount of material to be machined is set at 20 $\mu$m. If the latter is larger than 20 $\mu$m, the amount of material to be machined is set at the latter value. It is therefore possible to eliminate the unevenness of the thickness and the machining deteriorated layer without lowering the rate of operation and without failure during the polishing.

FIG. 3 shows the structure of the polishing stage 22.

The polishing pad 56 of the polishing stage 22 in FIG. 3 is attached to a polishing head 61 connected to an output shaft 60 of a motor (equivalent to a rotating means) 58. Guide blocks 62 of a direct-acting guide are provided at the side of the motor 58. The guide blocks 62 are inserted into a guide rail 66 formed at the side of a support plate 64 in such a manner as to freely move vertically. Thus, the polishing pad 56 and the motor 58 are attached to the support plate 64 in such a manner as to freely move in the vertical direction.

The support plate 64 is provided at an end of a horizontally-arranged long arm 68. A base end of the arm 68 connects to an output shaft 74 of a motor 72 in a casing 70. Running the motor 72 rotates the arm 68 about the output shaft 74. Consequently, the polishing pad 56 can be moved within a range between the polishing position indicated by a solid line in FIG. 1, the polishing pad cleaning position for the polishing pad cleaning stage 23 and the dressing position for the polishing pad dressing stage 27. When the polishing pad 56 is moved to the polishing pad cleaning position, the polishing pad cleaning stage 23 removes the polishing chips and the like from the surface of the polishing pad 56. The polishing pad 56 is made of, for example, polyurethane foam, and the polishing pad cleaning stage 23 has a removal member such as a brush for removing the polishing chips. When the polishing pad 56 is cleaned, the removal member and the polishing pad 56 are rotated by the motor 58 (see FIG. 3). The polishing pad dressing stage 27 is made of, for example, of polyurethane foam as is the case with the polishing pad 56.

Guide blocks 76 of a direct-acting guide are provided at the side of the casing 70, and the guide blocks 76 are inserted into a guide rail 80 formed at the side of a screw feed unit housing 78 in such a manner as to freely move vertically. A nut member 82 projects from the side of the casing 70. The nut member 82 is inserted into the housing 78 through an opening 79 formed in the housing 78, and is screwed down on a thread rod 81 of a screw feed unit (equivalent to a positioning mechanism). An output shaft 84 of a motor 82 connects to the top end of the thread rod 81. Running the motor 82 and the rotating the thread rod 81 vertically move the casing 70 due to the feeding of the screw feed unit and the straight movement of the guide blocks 76 and the rail 80. Consequently, the polishing pad 56 is moved vertically to set a desired interval between the polishing head 61 and the wafer 28.

A piston 88 of an air cylinder apparatus (equivalent to a pressurizing mechanism) 86 connects to the top of the motor 58 through a hole 69 of the arm 68. The air cylinder apparatus 86 connects to a regulator 90 that controls the inner pressure P of the cylinder. Therefore, the pressing force of the polishing pad 56 against the wafer 28 can be controlled by controlling the inner pressure P with the regulator 90.

After the rotation of the arm 68 moves the polishing pad 56 away from the wafer 28, the wafer 28 having been polished by the polishing stage 22, is held by a hand 97 of a robot 96 in FIG. 2 and is transferred to the wafer cleaning stage 24. The robot 96 is not illustrated in FIG. 1. The machining deteriorated layer has already been eliminated from the polished wafer 28 to prevent the wafer 28 from being damaged. Therefore, the wafer 28 is not damaged during the transfer by the robot 96 and the cleaning by the wafer cleaning stage 24.

In this embodiment, the polishing pad 56 is used to polish the wafer 28, but this invention should not be restricted to this. For example, the wafer 28 may be polished by a polishing wheel or electrophoresis of abrasive grains. In this case, it is preferable to perform a constant cutting depth polishing.

A stage having a rinsing function and a spin drying function is employed as the wafer cleaning stage 24. The wafer 28 cleaned and dried by the wafer cleaning stage 24 is held by the hand 31 of the robot 31, and is placed on a predetermined shelf of the cassettes 26. That completes the wafer machining process in the planarization apparatus 10 of this embodiment.

As stated above, the planarization apparatus 10 according to this embodiment roughly grinds, finely grinds and polishes the wafer 28 since the body 12 is provided with the polishing stage 22 as well as the rough grinding stage 18 and the fine grinding stage 20.

This eliminates the necessity of transferring the wafer 28 from the planarization apparatus 10 to an etching apparatus. Thus, the rough grinding stage 18 and the fine grinding stage 20 can grind the wafer 28 to the thickness close to the standardized thickness. The conventional planarization apparatus grinds the wafer in such a manner as to remain the etching allowance of 150 $\mu$m in order to prevent the wafer from being damaged during the transfer, whereas the planarization apparatus 10 of this embodiment may grind the wafer with the polishing allowance of, for example, 3 $\mu$m.

This substantially reduces the polishing time, and increases the throughput. Polishing the wafer 28 removes the machining deteriorated layer formed by the grindings, and this eliminates the necessity for etching the wafer 28 in the post-treatment. This simplifies the entire structure of the wafer manufacturing line. Moreover, the planarization apparatus 10 has the polishing pad cleaning stage 23 for cleaning the polishing pad 56 of the polishing stage 22 and the polishing pad dressing stage 27 for dressing the polishing pad 56. Therefore, the polishing pad 56 can be cleaned and dressed in the same apparatus 10. Consequently, the polishing pad 56 can be handled easily. There is provided a sensing means for sensing a loading in the polishing pad 56 (such a loading as to affect the machining). If the apparatus is automatically controlled so that the polishing pad dressing stage 27 dresses the polishing pad 56 when the sensing means senses the loading, the planarization apparatus 10 can be fully automated. An example of the sensing means is a means for sensing the rotational torque of the motor 58 for the polishing pad 56. The polishing pad 56 is cleaned when the rotational torque exceeds a reference value.

The planarization apparatus 10 can roughly grind, finely grind and polish the wafer 28, which is held by the same chuck 32 (36, 38, 40), by rotating the index table 34. This prevents the wafer from being damaged due to the transfer of the wafer 28, and enables the accurate machining of the wafer 28. On the other hand, if the wafer 28 is transferred from one chuck to another at each stage, the wafer may be damaged during the transfer. Moreover, the accuracy of the suction face of the chuck changes every time the wafer is transferred, and the changes in the accuracy affect the wafer machining accuracy. This makes impossible the accurate machining. Thus, the planarization apparatus 10 of this embodiment solves the problem of the conventional apparatus.

Furthermore, the polishing stage 22 removes the machining deteriorated layer from the wafer 28 and eliminates the unevenness in the thickness of the wafer 28 by extending the machining time.

In this embodiment, the wafer is used as a workpiece, but this invention should not be restricted to this. The planarization apparatus of this embodiment may also be applied to any kinds of workpieces that require the polishing after the grinding.

Figure 13:
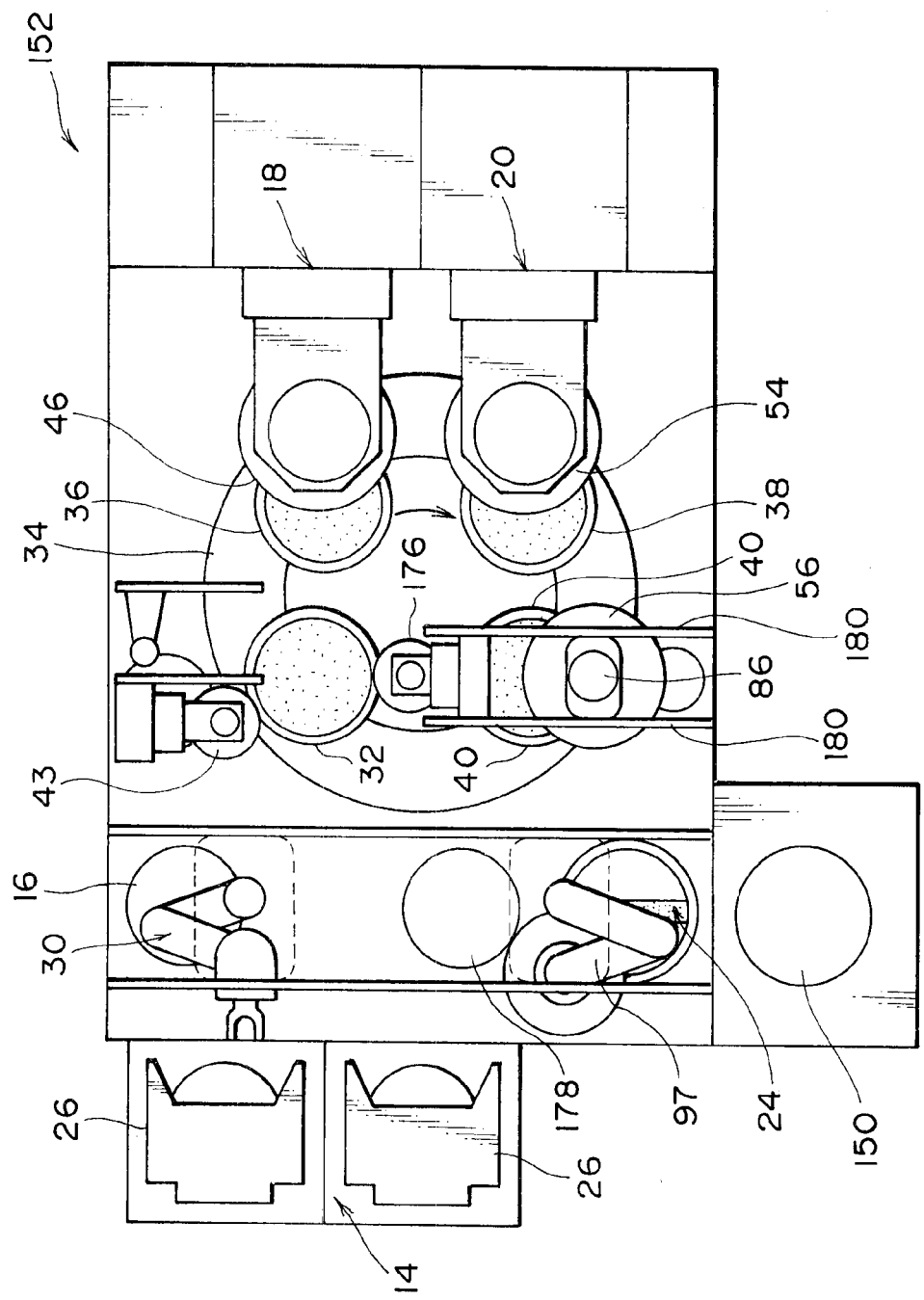
FIG. 13 is a plan view showing the first embodiment of a planarization apparatus provided with an etching unit.

FIG. 13 is a plan view showing the first embodiment of a planarization apparatus 152 provided with an etching unit 150. Parts similar to those described with reference to FIG. 10 are denoted by the same reference numerals, and they will not be described.

The planarization apparatus 152 in FIG. 13 etches the wafer 28 polished by the polishing stage 22. The robot 97 holds the polished wafer 28, which is positioned on the chuck 32 by rotating the index table 34 by 90° clockwise. Then, the robot 97 transfers the wafer 28 to the cleaning stage 24, which cleans the wafer 28. The cleaned wafer 28 is transferred to the etching unit 150. Wafers that are not etched while being held by the chuck may be damaged during the transfer by the robot 97. However, since the machining deteriorated layer is removed at the polishing stage 22 prior to the etching process, the wafer 28 is never damaged during the transfer by the robot 97.

The etching unit 150 is a spin etching unit, which is comprised mainly of a chuck 154 for holding the wafer 28 by suction, a motor 156 and a spindle 158 for rotating the chuck 154, a nozzle 162 for supplying an etching liquid 160, and an etching tank 164. In the etching unit 150, the wafer 28 is held by a porous material 155 of the chuck 154, and the etching liquid 160 is supplied to the center of the top of the wafer 28 through the nozzle 162 while the motor 156 is rotating the wafer 28 at a predetermined rotation speed. The radially-diffused etching liquid 160 etches the wafer 28. The nozzle 162 connects to an etching liquid tank 168 through a pump 166, and running the pump 166 supplies the etching liquid 160 from the etching liquid tank 168 through the nozzle 162.

The spindle 158 is inserted into a hole 172 formed at the center of a bottom 170, and the bottom 170 is inclined downward toward the outer peripheral in order to prevent the etching liquid 160 scatted from the wafer 28 from leaking through the hole 172. A drain pipe 174 connects to the outer periphery of the bottom 170, and the etching liquid is discharged through the drain pipe 174.

In the planarization apparatus 152 of this embodiment, the polishing stage 22 has a wafer cleaning unit 176 as shown in FIG. 13, and a spin cleaner 178 is provided near the cleaning stage 24. The wafer cleaning unit 176 is capable of running on a pair of rails 180, and is moved to a position above the wafer 28 held on the chuck in order to clean the wafer 28 before or after the polishing. On the other hand, the spin cleaner 178 cleans the wafer 28 before and after the etching. The etched wafer 28 having been transferred to the spin cleaner 178 is spin cleaned, and the robot 97 holds the wafer 28 again and places it on a predetermined shelf of the cassettes 26.

Figure 15:
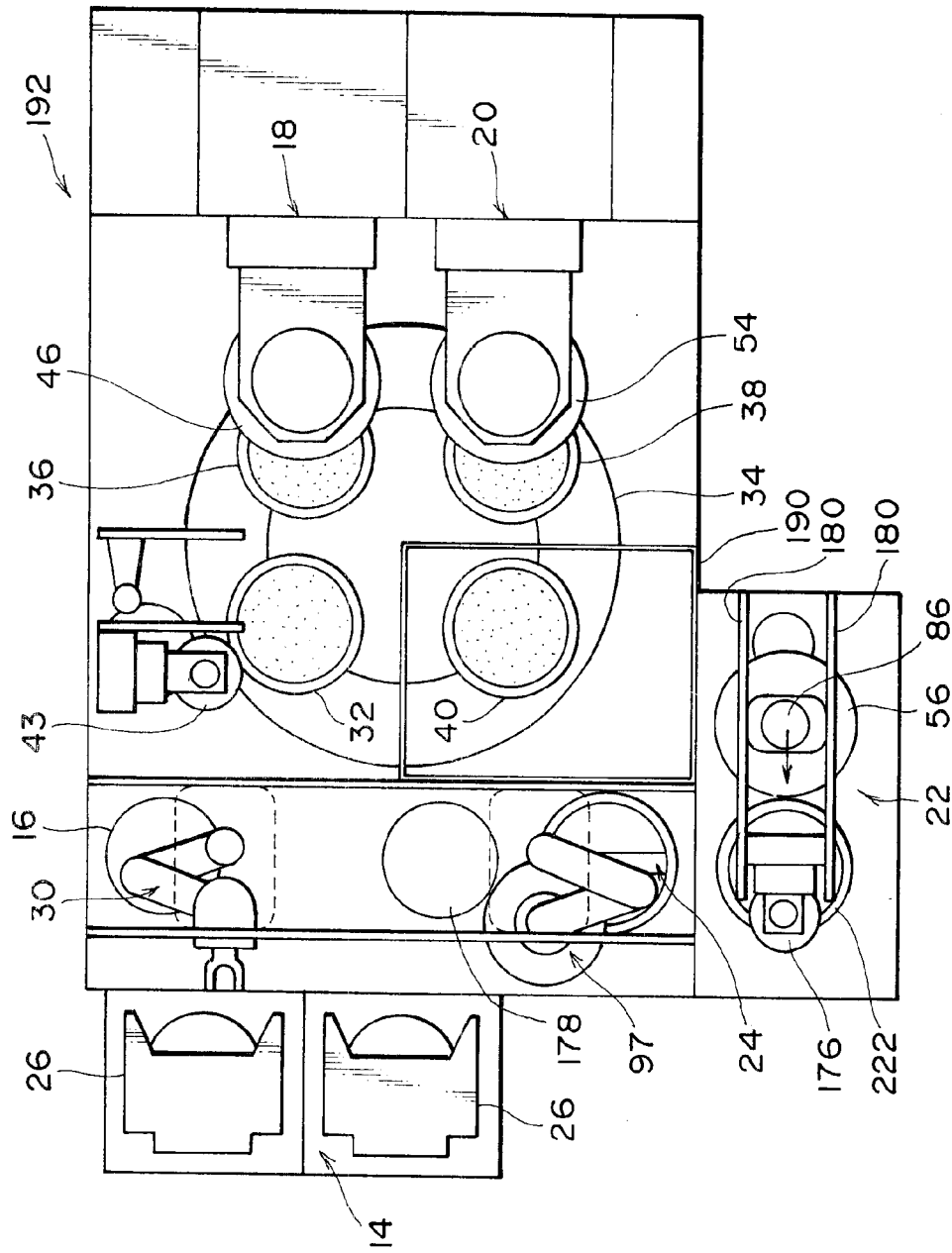
FIG. 15 is a plan view showing the second embodiment of a planarization apparatus provided with an etching unit.

FIG. 15 is a plan view showing the second embodiment of a planarization apparatus 192 provided with an etching unit 190. Parts similar to those of the planarization apparatus 10 in FIG. 2 and the planarization apparatus 152 in FIG. 13 are denoted by the same reference numerals, and they will not be described.

The planarization apparatus 192 in FIG. 15 etches the wafer 28 finely ground by the fine grinding stage 20, and more particularly etches the wafer 28 before polishing. The finely-ground wafer 28 is transferred to the etching unit 190 by rotating the index table 34 clockwise by 90°. The etching unit 190 etches the wafer 28 held on the chuck 40. The robot 97 holds the etched wafer 28 on the chuck 32. Then, the robot 97 transfers the wafer 28 to the cleaning stage 24. The wafer 24 is cleaned at the cleaning stage 24, and is then transferred to the polishing stage 22. The planarization apparatus 192 etches the wafer 28 held on the chuck to remove the machining deteriorated layer. Thus, the wafer 28 is never damaged during the transfer by the robot 97.

The etching unit 190 is a spin etching unit, which is comprised mainly of the chuck 40 for holding the wafer 28 by suction, a motor 194 and a spindle 196 for rotating the chuck 40, a nozzle 200 for supplying an etching liquid 198, and an etching tank 202.

Figure 16:
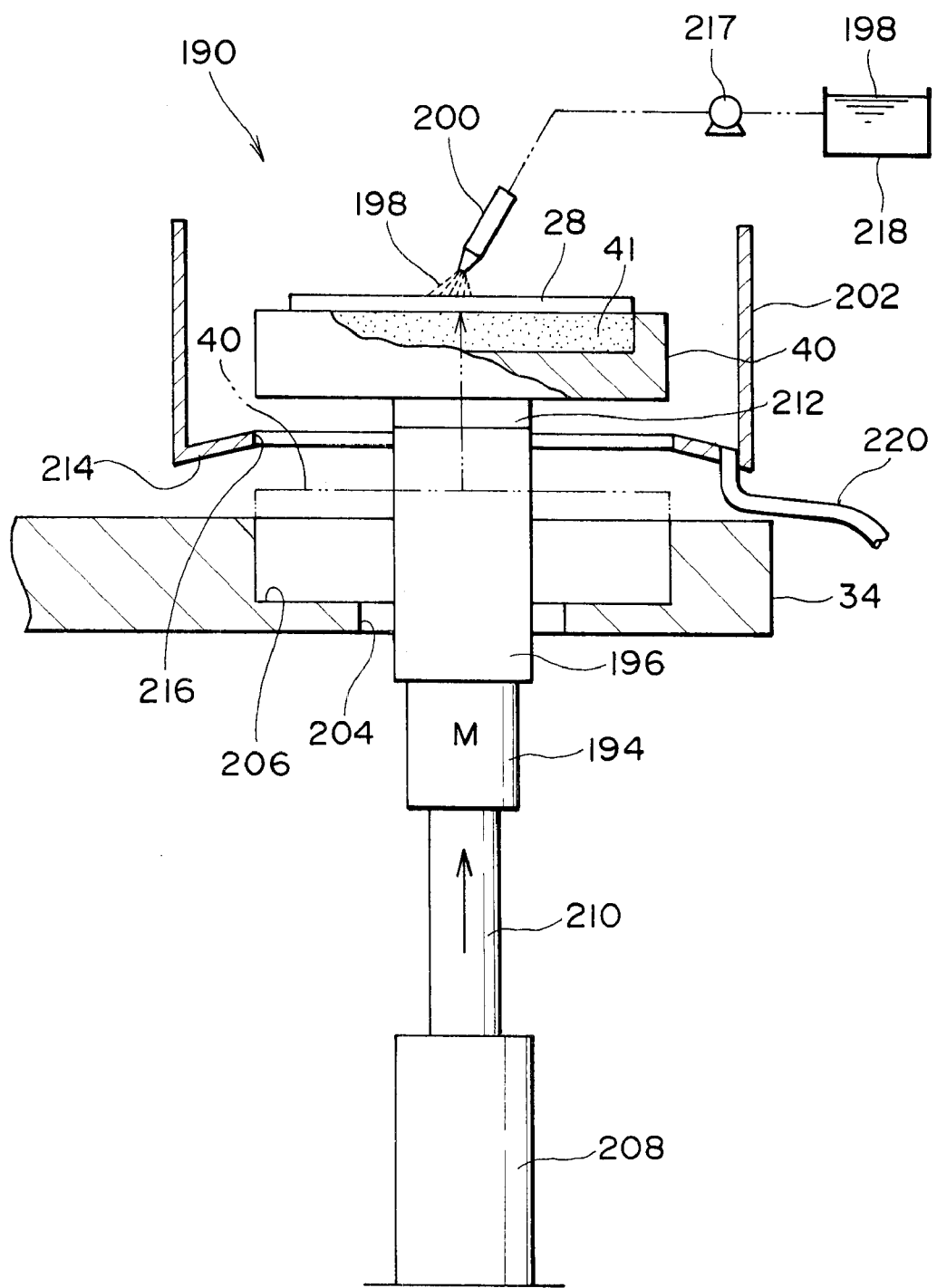
FIG. 16 is a sectional view showing the structure of the etching unit in FIG. 15.

The chuck 40 is placed on a step 206 of an opening 204 formed in the index table 34, and a piston 210 of a cylinder 208 connects to the bottom of the motor 194. When the piston 210 is contracted, the piston 210 is located at a position away from the chuck 40, and when the piston 210 is expanded as shown in FIG. 16, the spindle 196 passes through the opening 204 and a connecting member 212 provided at the top of the spindle 196 is fitted in a concave part (not illustrated) formed at the bottom of the chuck 40 so that the spindle 196 can be connected to the chuck 40. The continuous expansion of the piston 210 rises the chuck 40 from the index table 34, and positions the chuck 40 in the etching tank 202 through a hole 216 formed at the bottom 214 of the etching tank 202.

In the etching unit 190, the wafer 28 is held by the porous material 41 of the chuck 40, and the etching liquid 198 is supplied to the center of the top of the wafer 28, that is rotated at a predetermined rotation speed by the motor 194, through the nozzle 200 and the radially-diffused etching liquid 198 etches the wafer 28. The nozzle 200 connects to an etching liquid tank 218 through a pump 217, and running the pump 217 supplies the etching liquid 198 from the etching liquid tank 218 through the nozzle 200.

The hole 216 is formed at the center of the bottom 214 of the etching tank 202, and the bottom 214 is inclined downward toward the outer periphery in order to prevent the etching liquid 198 scattered from the wafer 28 from leaking through the hole 216. A drain pipe 220 connects to the outer periphery of the bottom 214, and the etching liquid is discharged through the drain pipe 220.

The polishing stage 22 of the planarization apparatus 192 has a chuck 222 for holding the etched wafer 28 transferred by the robot 97 as shown in FIG. 15. The wafer 28 is held on the chuck 222, and is polished in the state wherein the polishing pad 56 is pressed against the top of the wafer 28 while a motor (not illustrated) for rotating the chuck 222 is rotating the wafer 28. The robot 97 transfers the polished wafer 28 to the spin cleaner 178, which spin cleans the wafer 28. Then, the robot 97 holds the wafer 28 again and places it on a predetermined shelf of the cassettes 26.

As set forth hereinabove, the planarization apparatus according to the present invention has both the workpiece grinding means and the workpiece polishing means, so that the workpiece can be ground and polished by one planarization apparatus. This increases the throughput without damaging the workpiece.

According to the present invention, the workpiece is ground and polished in the state of being held by the same holding means, and this enables the accurate machining without damaging the workpiece.

According to the present invention, the planarization apparatus is provided with the cleaning means for cleaning the polishing pad of the polishing means and/or the dressing means. Thus, the same apparatus cleans and dresses the polishing pad when the polishing pad becomes stained or loaded.

According to the present invention, the polishing means or the etching means removes the machining deteriorated layer from one side of the workpiece ground by the grinding means and eliminates the unevenness in the thickness of the workpiece. This enables the accurate machining.

In the planarization method according to the present invention, the fine grinding means finely grinds the workpiece by an amount more than an amount required for removing a machining deteriorated layer formed by the rough grinding, calculated by doubling a standard deviation, and less than a larger value between an amount required for correcting an unevenness of a thickness during the rough grinding and removing the machining deteriorated layer, calculated by sextupling a standard deviation, and 150 μm. This enables the removal of the machining deteriorated layer formed by the rough grinding without lowering the rate of operation. The polishing means polishes the workpiece by an amount more than an amount required for removing a machining deteriorated layer formed by the fine grinding, calculated by doubling a standard deviation, and less than a larger value between an amount required for correcting an unevenness of a thickness during the fine grinding and removing the machining deteriorated layer, calculated by sextupling a standard deviation, and 20 μm. This enables the removal of the machining deteriorated layer formed by the fine grinding without lowering the rate of operation.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A planarization apparatus, comprising:

holding means for holding a workpiece;

grinding means which has a grinding wheel for grinding said workpiece and grinds one side of said workpiece by said grinding wheel; and one of a polishing means for polishing and an etching means for etching the one side of said workpiece, said a polishing means comprising rotating means for rotating a polishing head and a positioning mechanism for setting an interval between said said polishing head and said workpiece.

2. The planarization apparatus as defined in claim 1, further comprising:

moving means for moving said holding means between a grinding position for said grinding means to grind said workpiece and one of a polishing position for said polishing means to polish said workpiece and an etching position for said etching means to etch said workpiece;

wherein said workpiece is ground and one of polished and etched in a state of being held by said holding means.

3. The planarization apparatus as defined in claim 2, wherein said holding means is provided in a plural number, and said moving means is adapted to sequentially move said holding means from said grinding position to one of said polishing position and said etching position.

4. The planarization apparatus as defined in claim 3, wherein said holding means connects to a spindle for rotating said holding means, said spindle being moved together with said holding means.

5. The planarization apparatus as defined in claim 3, wherein said holding means is detachably connected to a spindle for rotating said holding means, and when said holding means is moved, a connecting part of said holding means is separated from said spindle and only said holding means is moved.

6. The planarization apparatus as defined in claim 2, wherein said holding means connects to a spindle for rotating said holding means, said spindle being moved together with said holding means.

7. The planarization apparatus as defined in claim 2, wherein said holding means is detachably connected to a spindle for rotating said holding means, and when said holding means is moved, a connecting part of said holding means is separated from said spindle and only said holding means is moved.

8. The planarization apparatus as defined in claim 2, wherein said planarization apparatus has etching means for etching said workpiece before or after polishing.

9. The planarization apparatus as defined in claim 2, further comprising: one of a cleaning means for cleaning a polishing pad attached to said polishing head of said polishing means, and a dressing means for dressing a surface of said polishing pad.

10. The planarization apparatus as defined in claim 9, wherein the apparatus has a control which causes one of said grinding means, said polishing means and said etching means to remove a machining deteriorated layer formed at the one side of said workpiece ground in previous machining.

11. The planarization apparatus as defined in claim 10, further comprising a sensor for measuring the thickness of said workpiece prior to machining or during machining, said planarization apparatus controlling the amount of material to be ground or one of polished and etched in accordance with a measured value.

12. The apparatus of claim 10, wherein said control causes said one of said grinding means, said polishing means and said etching means to further remove an unevenness of the thickness of said workpiece.

13. The planarization apparatus as defined in claim 2, wherein the apparatus has a control which causes one of said grinding means, said polishing means and said etching means to remove a machining deteriorated layer formed at the one side of said workpiece ground in previous machining.

14. The apparatus of claim 13, wherein said control causes said one of said grinding means, said polishing means and said etching means to further remove an unevenness of the thickness of said workpiece.

15. The planarization apparatus as defined in claim 13, further comprising a sensor for measuring the thickness of said workpiece prior to machining or during machining, said planarization apparatus controlling the amount of material to be ground or one of polished and etched in accordance with a measured value.

16. The planarization apparatus as defined in claim 1, further comprising cleaning means for cleaning a polishing pad attached to said polishing head of said polishing means, or dressing means for dressing a surface of said polishing pad.

17. The planarization apparatus as defined in claim 16, wherein the apparatus has a control which causes one of said grinding means, said polishing means and said etching means to remove a machining deteriorated layer formed at the one side of said workpiece ground in previous machining.

18. The apparatus of claim 17, wherein said control causes said one of said grinding means, said polishing means and said etching means to further remove an unevenness of the thickness of said workpiece.

19. The planarization apparatus as defined in claim 17, further comprising a sensor for measuring the thickness of said workpiece prior to machining or during machining, said planarization apparatus controlling the amount of material to be ground or one of polished and etched in accordance with a measured value.

20. The planarization apparatus as defined in claim 1, wherein said holding means is one of holding means for holding said workpiece by suction, holding means for freeze-holding said workpiece through ice film, and electrostatic holding means for holding said workpiece with static electricity.

21. The planarization apparatus as defined in claim 1, further comprising a partitioning member for partitioning off a polishing position for said polishing means to polish said workpiece.

22. The planarization apparatus as defined in claim 1, wherein said planarization apparatus has etching means for etching said workpiece before or after polishing.

23. The planarization apparatus as defined in claim 1, wherein the apparatus has a control which causes one of said grinding means, said polishing means and said etching means to remove a machining deteriorated layer formed at the one side of said workpiece ground in previous machining.

24. The planarization apparatus as defined in claim 23, further comprising a sensor for measuring the thickness of said workpiece prior to machining or during machining, said planarization apparatus controlling the amount of material to be ground or one of polished and etched in accordance with a measured value.

25. The apparatus of claim 23, wherein said control causes said one of said grinding means, said polishing means and said etching means to further remove an unevenness of the thickness of said workpiece.

26. A planarization apparatus comprising:

holding means for holding a workpiece:

rough grinding means for roughly grinding said workpiece held by said holding means;

fine grinding means for finely grinding said workpiece roughly ground by said rough grinding means in the state wherein said holding means is holding said workpiece;

polishing means for polishing said workpiece finely ground by said fine grinding means in the state wherein said holding means is holding said workpiece;

moving means for moving said holding means to a rough grinding position for said rough grinding means, a fine grinding position for said fine grinding means, and a polishing position for said polishing means; and wherein said planarization apparatus has etching means for etching said workpiece before or after polishing.

27. A planarization method using a planarization apparatus comprising:

holding means for holding a workpiece;

grinding means for grinding said workpiece held by said holding means;

one of a polishing means for polishing and an etching means for etching said workpiece ground by said grinding means; and moving means for moving said holding means to a grinding position for said grinding means to grind said workpiece and to one of a polishing position for said polishing means to polish said workpiece and an etching position for said etching means to etch said workpiece;

wherein one of said polishing means polishes and said etching means etches said workpiece by an amount more than an amount required for removing a machining deteriorated layer formed by the grinding, calculated by doubling a standard deviation, and less than a larger value between an amount required for correcting an unevenness of a thickness during the grinding and removing said machining deteriorated layer, calculated by sextupling a standard deviation, and 20 µm.

28. The planarization method as defined in claim 27, wherein said planarization apparatus has a sensor for measuring the thickness of said workpiece prior to machining or during machining, said planarization apparatus controlling the amount of material to be ground or one of polished and etched in accordance with a measured value.

29. A planarization method using a planarization apparatus:

wherein said planarization apparatus comprises:

holding means for holding a workpiece;

rough grinding means for roughly grinding said workpiece held by said holding means;

fine grinding means for finely grinding said workpiece roughly ground by said rough grinding means;

one of a polishing means for polishing and an etching means for etching said workpiece finely ground by said grinding means; and moving means for moving said holding means to a rough grinding position for said rough grinding means, a fine grinding position for said fine grinding means and to one of a polishing position for said polishing means and an etching position for said etching means;

wherein said fine grinding means finely grinds said workpiece by an amount more than an amount required for removing a machining deteriorated layer formed by the rough grinding, calculated by doubling a standard deviation, and less than a larger value between an amount required for correcting an unevenness of a thickness during the rough grinding and removing said machining deteriorated layer, calculated by sextupling a standard deviation, and 150 µm; and wherein one of said polishing means polishes and said etching means etches said workpiece by an amount more than an amount required for removing a machining deteriorated layer formed by the fine grinding, calculated by doubling a standard deviation, and less than a larger value between an amount required for correcting an unevenness of a thickness during the fine grinding and removing said machining deteriorated layer and calculated by sextupling a standard deviation, and 20 µm.

30. The planarization method as defined in claim 29, wherein said planarization apparatus has a sensor for measuring the thickness of said workpiece prior to machining or during machining, said planarization apparatus controlling the amount of material to be ground or one of polished and etched in accordance with a measured value.

31. A planarization apparatus, comprising:

holding means for holding a workpiece;

grinding means for grinding said workpiece held by said holding means;

one of a polishing means for polishing and an etching means for etching said workpiece ground by said grinding means; and moving means for moving said holding means to a grinding position for said grinding means to grind said workpiece and to one of a polishing position for said polishing means to polish said workpiece and an etching position for said etching means to etch said workpiece, wherein the apparatus has a control which causes said one of said polishing means and said etching means to remove an amount of material from said workpiece that is more than an amount required for removing a machining deteriorated layer formed by the grinding, calculated by doubling a standard deviation, and is less than a larger value between an amount required for correcting an unevenness of a thickness during the grinding and for removing said machining deteriorated layer, calculated by sextupling a standard deviation, and 20 µm.

32. The planarization apparatus as defined in claim 31, wherein said control comprises a sensor for measuring the thickness of said workpiece prior to machining or during machining, said planarization apparatus controlling the amount of material to be removed by one of said grinding, polishing and etching in accordance with a measured value of said thickness.

33. A planarization apparatus, comprising:

holding means for holding a workpiece;

rough grinding means for roughly grinding said workpiece held by said holding means;

fine grinding means for finely grinding said workpiece roughly ground by said rough grinding means;

one of a polishing means for polishing and an etching means for etching said workpiece finely ground by said grinding means; and moving means for moving said holding means to a rough grinding position for said rough grinding means, a fine grinding position for said fine grinding means and to one of a polishing position for said polishing means and an etching position for said polishing means, wherein said fine grinding means finely grinds said workpiece by an amount more than an amount required for removing a machining deteriorated layer formed by the rough grinding, calculated by doubling a standard deviation, and less than a larger value between an amount required for correcting an unevenness of a thickness during the rough grinding and removing said machining deteriorated layer, calculated by sextupling a standard deviation, and 150 µm; and wherein one of said polishing means polishes and said etching means etches said workpiece by an amount more than an amount required for removing a machining deteriorated layer formed by the fine grinding, calculated by doubling a standard deviation, and less than a larger value between an amount required for correcting an unevenness of a thickness during the fine grinding and removing said machining deteriorated layer and calculated by sextupling a standard deviation, and 20 µm.

34. The planarization apparatus as defined in claim 33, further comprising a sensor for measuring the thickness of said workpiece prior to machining or during machining, said planarization apparatus controlling the amount of material to be removed by one of said grinding, polishing and etching in accordance with a measured value of said thickness.

35. A planarization apparatus, comprising:

holding means for holding a workpiece;

rough grinding means for roughly grinding said workpiece held by said holding means;

fine grinding means for finely grinding said workpiece roughly ground by said rough grinding means;

one of a polishing means for polishing and an etching means for etching said workpiece finely ground by said grinding means; and moving means for moving said holding means to a rough grinding position for said rough grinding means, a fine grinding position for said fine grinding means and to one of a polishing position for said polishing means and an etching position for said etching means, wherein a machining time of the rough grinding, a machining time of the fine grinding, and a machining time of one of the polishing and etching are substantially equal to each other; and wherein one of said fine grinding means, said polishing means and said etching means adjusts a machining amount to remove a machining deteriorated layer formed by previous machining on said workpiece.

* * * * *